(12) United States Patent
Sivakumar et al.

(10) Patent No.: US 10,211,625 B2
(45) Date of Patent: Feb. 19, 2019

(54) MITIGATION OF ARC FLASH HAZARD IN PHOTOVOLTAIC POWER PLANTS

(71) Applicant: SunPower Corporation, San Jose, CA (US)

(72) Inventors: Seshadri Sivakumar, Austin, TX (US); Jiyong Lian, Austin, TX (US); Venkat Reddy Konala, Montgomery Village, MD (US); David Barr, Berkeley, CA (US); Priyantha Sirisooriya, Cedar Park, TX (US); Jacqueline Ahmad, Austin, TX (US); Jason Spokes, Los Angeles, CA (US)

(73) Assignee: SunPower Corporation, San Jose, CA (US)

( * ) Notice: Subject to any disclaimer, the term of this patent is extended or adjusted under 35 U.S.C. 154(b) by 231 days.

(21) Appl. No.: 14/958,699

(22) Filed: Dec. 3, 2015

(65) Prior Publication Data

US 2016/0087425 A1 Mar. 24, 2016

Related U.S. Application Data

(63) Continuation of application No. 13/622,270, filed on Sep. 18, 2012, now Pat. No. 9,240,682.

(51) Int. Cl.
*H02H 7/122* (2006.01)
*H01L 31/02* (2006.01)
*H02M 7/00* (2006.01)
*H02J 3/38* (2006.01)
*H02S 40/36* (2014.01)

(52) U.S. Cl.
CPC ....... *H02H 7/122* (2013.01); *H01L 31/02021* (2013.01); *H02J 3/383* (2013.01); *H02M 7/00* (2013.01); *H02S 40/36* (2014.12); *Y02E 10/50* (2013.01); *Y02E 10/563* (2013.01)

(58) Field of Classification Search
CPC .................................................... H02H 7/122
USPC ...... 363/16, 17, 21.02, 21.03, 55, 56.01, 97, 363/131, 132, 95, 101, 34, 37, 65, 67, 71;
(Continued)

(56) References Cited

U.S. PATENT DOCUMENTS 3,526,778 A * 9/1970 Crocker ................. H02J 9/066
290/30 R
4,362,950 A * 12/1982 Turner .................... H02M 7/64
307/326

(Continued)

*Primary Examiner* — Adolf Berhane
*Assistant Examiner* — Nusrat Quddus
(74) *Attorney, Agent, or Firm* — Okamoto & Benedicto LLP

(57) ABSTRACT

Arc flash mitigation devices are employed to protect personnel during maintenance of photovoltaic inverters. During normal operation, an alternating current (AC) output of a photovoltaic inverter is coupled to a low voltage winding of a step up transformer through a bus-bar (e.g., an electrically conductive interconnect), which has higher current rating than a fuse. During maintenance, the bus-bar is replaced with the fuse. The fuse may be employed in conjunction with a switch. The switch may be a disconnect switch that places the bus-bar in parallel with the fuse during normal operation, and decouples the bus-bar from the fuse during maintenance. The switch may also be a transfer switch that places either the bus-bar or the fuse in series with the AC output of the photovoltaic inverter and the low voltage winding of the step up transformer.

20 Claims, 13 Drawing Sheets

(58) Field of Classification Search
USPC ............... 323/906, 259, 322, 323, 344, 351;
307/82, 64, 66, 131; 136/244, 291, 252
See application file for complete search history.

(56) References Cited

U.S. PATENT DOCUMENTS

| | | | | |
|---|---|---|---|---|
| 9,240,682 B2* | 1/2016 | Sivakumar | ............. | H02H 7/122 |
| 9,373,958 B2* | 6/2016 | Sivakumar | ............. | H02J 3/383 |
| 2012/0326511 A1* | 12/2012 | Johnson | ................ | H02J 3/383 |
| | | | | 307/52 |
| 2014/0078793 A1* | 3/2014 | Sivakumar | ............. | H02H 7/122 |
| | | | | 363/55 |

* cited by examiner

MITIGATION OF ARC FLASH HAZARD IN PHOTOVOLTAIC POWER PLANTS

CROSS-REFERENCE TO RELATED APPLICATION

This application is a continuation of U.S. application Ser. No. 13/622,270, filed on Sep. 18, 2012, which is incorporated herein by reference in its entirety.

TECHNICAL FIELD

Embodiments of the subject matter described herein relate generally to solar cells. More particularly, embodiments of the subject matter disclosed herein relate to photovoltaic power plant operation and maintenance.

BACKGROUND

Photovoltaic power plants employ solar cells to convert solar radiation to electrical energy. Photovoltaic power plants also include photovoltaic inverters ("inverters"), which convert direct current (DC) generated by the solar cells to alternating current (AC) suitable for delivery to a point of interconnect with a utility grid through a network of transformers and transmission lines. Inverters are often employed in inverter stations that comprise multiple inverters connected to a single multiple-winding medium voltage step-up transformer, which in turn is connected to a medium voltage grid.

Arc flash is a serious workplace hazard when working on inverters, such as during maintenance. Mitigating arc-flash hazard in inverter stations poses several design challenges because the utility grid to which the inverter stations are connected serve as large fault current sources, leading to high arc-flash energies within the inverter stations during arc faults. In addition, effective commissioning and maintenance activities often require full internal access to inverters while the inverters are powered ON and connected live to the utility grid. The documents IEEE 1584-2002 by the Institute of Electrical and Electronic Engineers and NFPA-70E by the National Fire Protection Association provide guidelines to analyze and estimate the arc-flash energy at various locations within the electrical systems such as AC inverter stations and to determine the appropriate personal protective equipment (PPE) required for protection against potential arc flash events.

For generic, i.e., not necessarily for photovoltaic applications, electric equipment, arc flash mitigation solutions may include reducing arc current, increasing the working distance, and reducing the clearing time. These solutions, however, may be difficult to achieve or inadequate to protect workers at inverter stations.

Certain protective devices are current limiting by design. By limiting or reducing the current available for an arc fault, the corresponding incident energy is reduced during fault-clearing times that are typically short in duration (e.g., 1-3 cycles). Fault currents at these protective devices must be in the current limiting range for them to be effective. The potential problem of this solution is that below the fault current limit, the clearing time goes up significantly and, therefore, the incident energy level may exceed workable levels for a range of grid operating conditions of a photovoltaic power plant.

Increasing the working distance will significantly reduce the incident energy level because the incident energy is proportional to the square of the distance in open air. Working distance can be increased by using remote operating devices and extension tools (e.g., hot-sticks). However, in the case of inverter stations, many maintenance or commissioning activities need to have internal access to the inverters while the inverters are powered ON and connected live to the utility grid. Therefore, increasing the working distance may not be practical in inverter stations.

One popular method of reducing clearing times is to lower the current setting of the protective device, such as a circuit breaker. A disadvantage of this solution, in particular for inverter stations, is that the level to which the current setting can be lowered is limited for normal operating conditions due to the need to coordinate the breaker tripping characteristics with equipment protection needs and avoiding normal short-term transient currents from tripping the breaker.

Other solutions for mitigating arc flash hazards in general include provision of bus differential protection and zone selective interlocking, the specific implementations of which are highly system-dependent, typically complex, and not cost effective.

BRIEF SUMMARY

In one embodiment, arc flash mitigation devices are employed to protect personnel during maintenance of photovoltaic inverters. During normal operation, an alternating current (AC) output of a photovoltaic inverter is coupled to a low voltage winding of a step up transformer through a bus-bar (e.g., an electrically conductive interconnect), which has higher current rating than a fuse. During maintenance, the bus-bar is replaced with the fuse. The fuse may be employed in conjunction with a switch. The switch may be a disconnect switch that places the bus-bar in parallel with the fuse during normal operation, and decouples the bus-bar from the fuse during maintenance. The switch may also be a transfer switch that places either the bus-bar or the fuse in series with the AC output of the photovoltaic inverter and the low voltage winding of the step up transformer.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
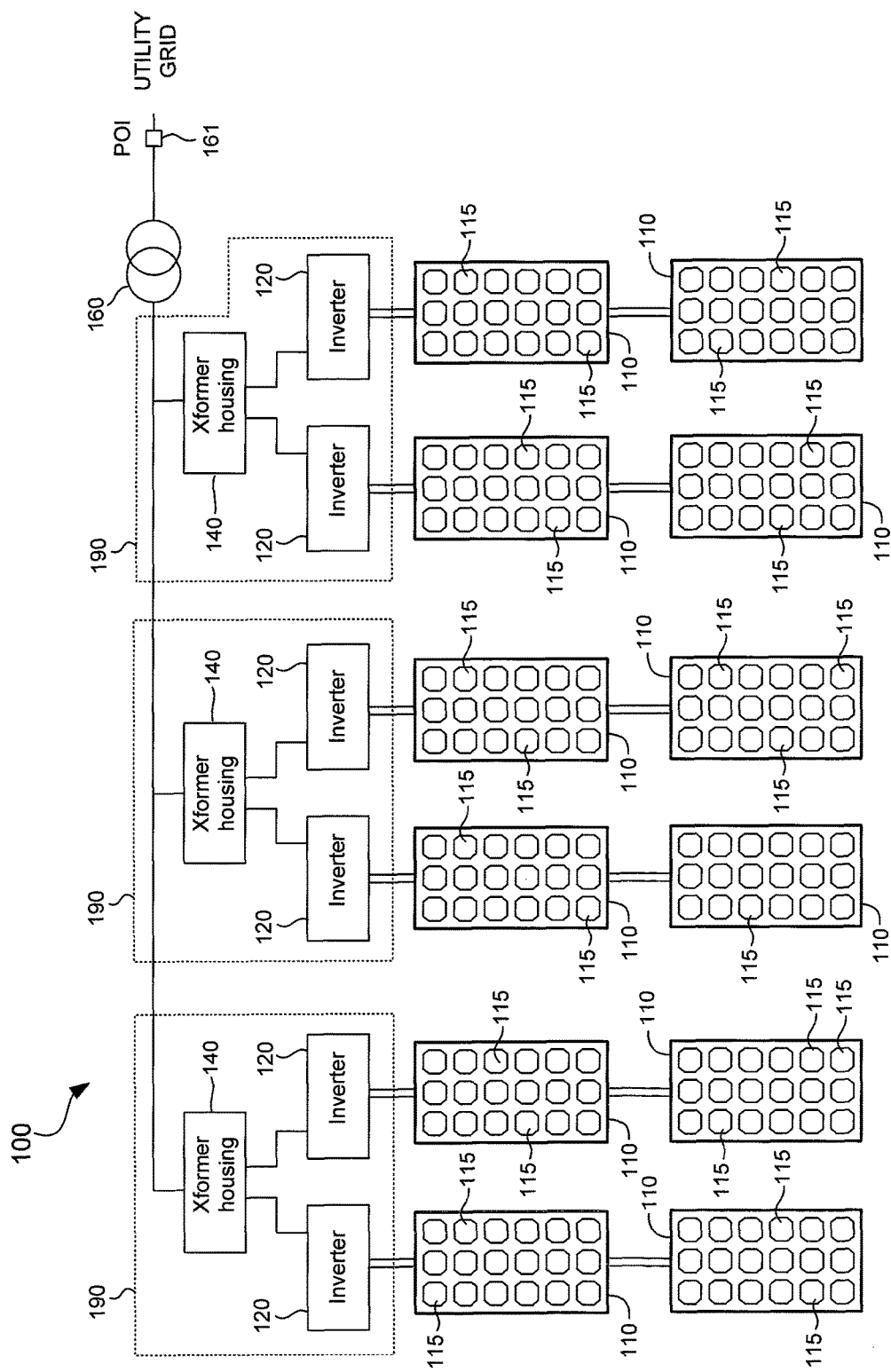
FIG. 1 shows a schematic diagram of a photovoltaic power plant in accordance with an embodiment of the present invention.

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Conventional solutions to arc flash hazard described above are based on the premise that the solution should be common to both normal operational and maintenance conditions, i.e., the solution needs to guarantee the arc flash risk category is not higher than appropriate for safely performing commissioning and maintenance activities while ensuring the normal operating conditions are not impacted. However, a single setting of a protective device for both operation and maintenance does not guarantee the protective device can clear the fault quickly for all available short-circuit current levels. For example, a circuit breaker may trip within 50 ms for currents higher than 1000 A but may take over 10 s for currents less than 800 A. Given that arc flash energy is a non-linear function of available fault current and is proportional to the fault clearing time, the highest potential short-circuit current level and its corresponding clearing time may not represent the worst-case scenario in terms of arc flash energy. In fact, the highest arc flash energy may correspond to a fault current level much below the maximum.

Also, while performing arc flash hazard analysis, it is quite common to assume that the utility grid is an infinite bus or that maximum fault current is available from the utility grid. However, these assumptions could yield inaccurate results, often underestimating the arc flash energy. In addition, these assumptions do not take into account future plant expansions or modifications that may significantly impact the available fault currents. In a large photovoltaic (PV) power plant where inverter stations are dispersed over hundreds of acres, the line impedances from inverter stations to the substation may vary significantly. Therefore, the available short circuit currents and hence the arc flash energy levels may widely vary among different inverter stations. A single point setting of the protective devices within a large PV power plant may not be sufficient for all the aforementioned complexities.

Furthermore, a single point setting of tripping time for the traditional circuit breaker solution, when the tripping current is set low, may introduce nuisance tripping that may result in undesired interruptions, frequent shutdowns, and restarts that impact reliable power production. On the other hand, if the tripping current setting is too high, the arc currents below the tripping level may still result in arc flash hazard simply because the resulting breaker trip time increases significantly. More specifically, if the arcing current exceeds the instantaneous setting, incident energy levels are very low. At arc currents lower than the instantaneous setting, the additional clearing time more than offsets the lower arc current to produce higher incident energy and therefore results in a more hazardous situation.

Solutions conventionally used for generic electric equipment and systems that involve reducing the protection device trip setting prior to performing maintenance activities to reduce fault clearance time and inserting a high impedance element between the utility grid and the equipment prior to performing maintenance activities to reduce fault current levels are not easily extendable to inverter stations due to high implementation costs and the extended procedural steps necessary for safely performing maintenance.

Accordingly, embodiments of the present invention provide arc flash mitigation solutions that are especially advantageous, cost effective, and practical for performing maintenance on inverters.

Referring now to FIG. 1, there is shown a schematic diagram of a PV power plant 100 in accordance with an embodiment of the present invention. The PV power plant 100 may include a plurality of transformer housings 140, a plurality of photovoltaic inverters 120, a plurality of photovoltaic modules 110, and a high voltage (HV) step up transformer 160. Control and other components of the PV power plant 100 not necessary for the understanding of the invention are not shown for clarity of illustration.

In the example of FIG. 1, an inverter station 190 includes one or more inverters 120 connected to a transformer housing 140. A transformer housing 140 may include a single multiple-winding medium voltage (MV) transformer to which all inverters 120 in the same inverter station 190 are connected. Groups of solar cells 115 may be packaged together in a photovoltaic module 110, which may be connected to an inverter 120 along with other photovoltaic modules 110. The solar cells 115 may comprise commercially-available solar cells, such as those available from SunPower Corporation of San Jose Calif. It is to be noted that only some of the solar cells 115 are labeled in FIG. 1 in the interest of clarity.

An inverter 120 converts DC current generated by a set of photovoltaic modules to AC current suitable for delivery to the utility grid at a point of interconnect (POI) 161. In the example of FIG. 1, the output of an inverter 120 is stepped up by an MV transformer of a transformer housing 140 and further stepped up by the transformer 160 before being provided to the utility grid, which may be operated by a utility company that provides electrical service to consumers.

Figure 2:
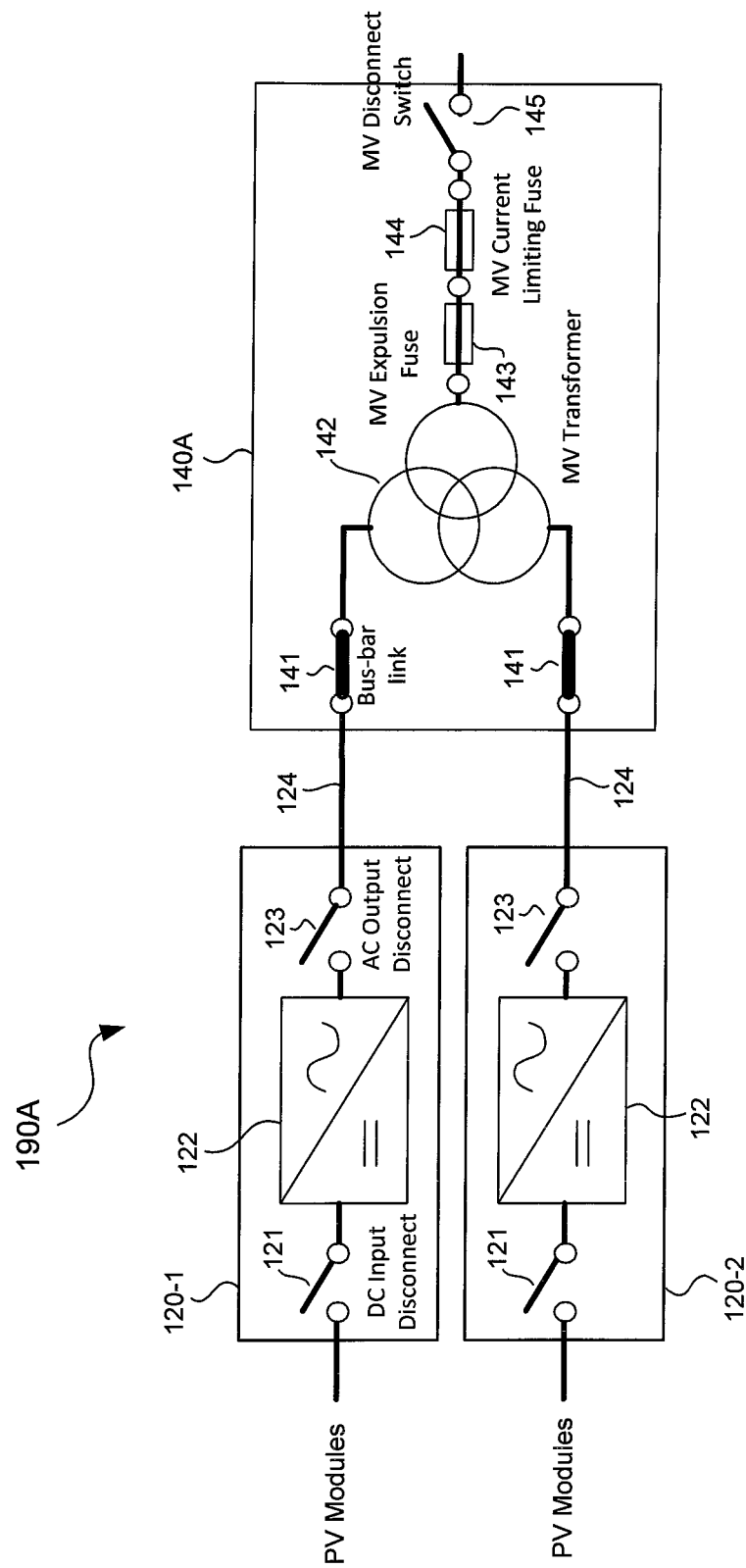
FIGS. 2 and 3 show schematic diagrams of a system in the form of an inverter station in accordance with an embodiment of the present invention.
Figure 3:
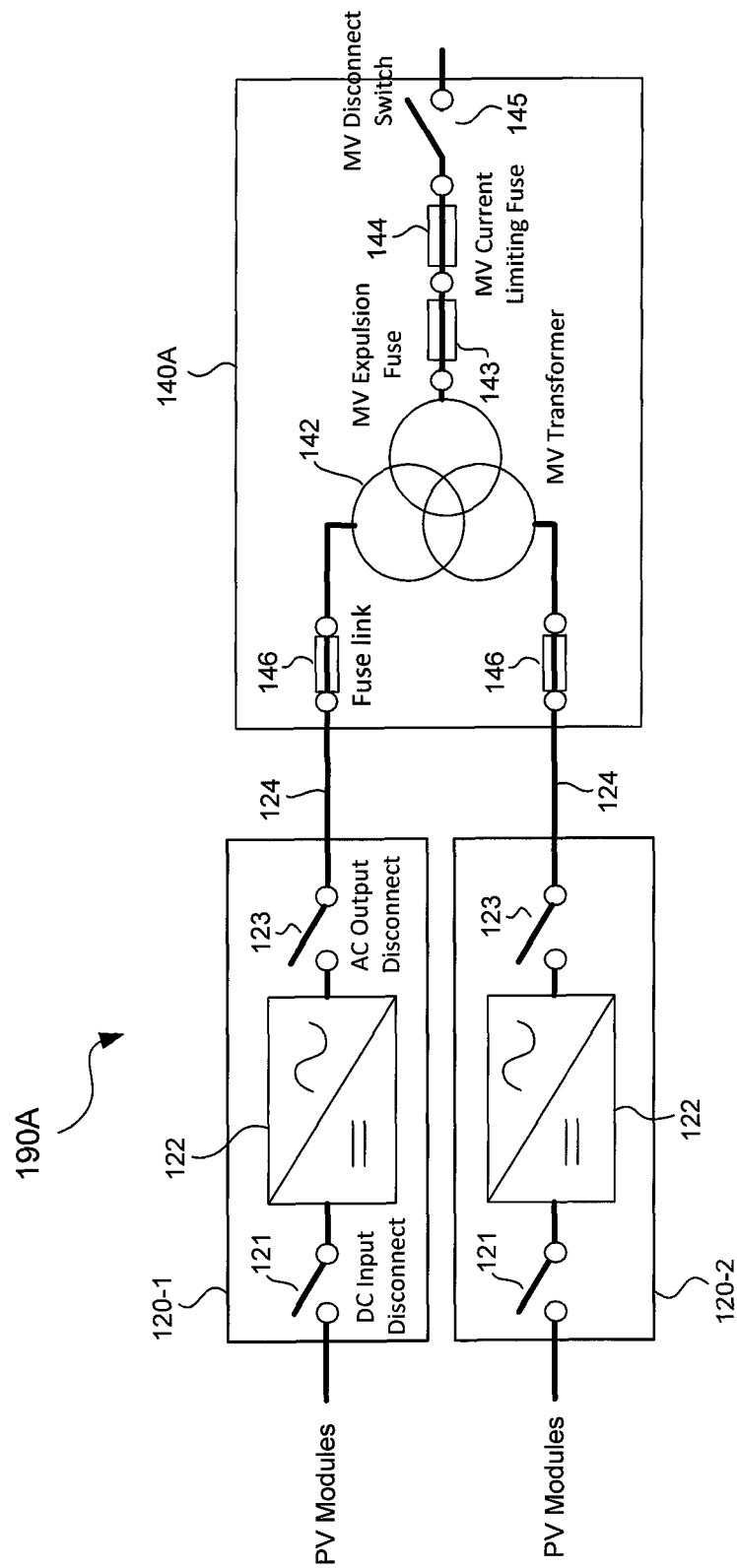

FIGS. 2 and 3 show schematic diagrams of a system in the form of an inverter station 190A in accordance with an embodiment of the present invention. The inverter station 190A is a particular embodiment of an inverter station 190 of the PV power plant 100 shown in FIG. 1. The inverter station 190A is illustrated using two inverters 120 (i.e., 120-1, 120-2) that are connected to a single multiple winding step up MV transformer 142. In general, an inverter station may have fewer or more inverters connected to an MV transformer. In one embodiment, the MV transformer 142 has two low voltage windings and a single high voltage winding. Each of the low voltage windings is coupled to an inverter 120 and the high voltage winding is coupled to the utility grid.

The transformer housing 140A shown in FIG. 2 is a particular embodiment of a transformer housing 140 of the PV power plant 100. The transformer housing 140A may enclose the MV transformer 142, an MV expulsion fuse 143, an MV current limiting fuse 144, and an MV disconnect switch 145 in the same protective housing for safety reasons. As will be more apparent below, a transformer housing may include different inverter-transformer links (e.g., bus-bar or contact links, fuse links, and switch-fuse links) within its housing in various embodiments of the present invention. The inverter-transformer links, which connect the inverters 120 to the MV transformer 142, may also be located outside a transformer housing.

The inverter station 190A is an example of a configuration with two inverters 120 connected to a single three-winding MV transformer 142. Other circuit configurations of an inverter station may include a single inverter or multiple parallel inverters connected through a two winding MV transformer.

An inverter 120 may comprise an inverter circuit 122, an AC output disconnect 123 and a DC input disconnect 121. The inverter circuit 122 comprises an electrical circuit for converting the DC power received from the photovoltaic modules 110 to a utility grid compatible output. The DC input disconnect 121 and the AC output disconnect 123 may comprise switches for disconnecting the inverter 120 from the photovoltaic modules 110 and the MV transformer 142, respectively. The inverters 120 may comprise commercially available photovoltaic inverters.

An inverter 120 has a DC input for receiving the DC output of the photovoltaic modules 110 and an AC output that is provided to the utility grid. The AC output of the inverter 120 is stepped up by the MV transformer 142 before being provided to the utility grid. In addition to stepping up the AC voltage, the MV transformer 142 provides galvanic isolation between the utility grid and the inverters 120, and hence to the photovoltaic modules 110.

Given that the inverters 120 are connected to a large utility grid with potentially large available fault current, potential for the occurrence of arc flash at the inverters 120 is a major safety concern. Although overcurrent protection is typically provided at the high voltage side of the MV transformer 142 by the fuses 143 and 144, the corresponding fault clearance times for faults at the low voltage side of the MV transformer 142 and the inverters 120 are generally long and widely varies, resulting in high incident arc energies in the region between the low voltage terminals of the MV transformer 142 and the AC outputs of the inverters 120. Insertion of an appropriate arc flash mitigation solution at this location between the MV transformer 142 and the inverters 120 will help ensure personnel safety, specifically while operating, commissioning, maintaining, or servicing the inverters 120. Preferably, the arc flash mitigation solution reduces the incident energy level from PPE class 4 or higher (>40 cal/cm$^2$) to PPE class 2 or lower (<8 cal/cm$^2$) consistently for all potentially available fault currents from the utility grid.

A conventional arc flash mitigation solution is to install dedicated circuit breakers within the MV transformer housing and in series with the inverter outputs. The circuit breakers help ensure that any potential occurrence of arc fault at the inverter outputs is instantly cleared by the associated circuit breaker such that the associated incident energies do not exceed PPE class 2 level. However, proper setting of circuit breaker tripping characteristics is a difficult task at best because the setting needs to ensure that the circuit breaker trips instantly for a wide range of arc fault currents with levels dependent on the available fault currents, while not responding to over and surge currents expected during normal operation. Also, in the cases where the circuit breakers are located within the MV transformer housing, the housing should be suitably designed to meet the environmental requirements of the circuit breakers, resulting in increased implementation costs.

In one embodiment, the inverter station 190A may have different inverter-transformer links depending on whether the inverter station 190A is on normal operation mode or maintenance mode. As its name implies, normal operation mode is when the inverters 120 are normally operating to provide solar generated power to the utility grid. Maintenance mode is when the inverters 120 are being maintained, serviced, or commissioned.

FIG. 2 shows the connection configuration of the outputs of the inverters 120 to the MV transformer 142 in normal operation mode. In normal operation, a bus-bar link 141 (e.g., an electrically conductive interconnect) serves as an inverter-transformer link connecting an inverter 120 to the MV transformer 142. A bus-bar link 141 is preferably, but not necessarily, enclosed within the transformer housing 140A. A single wire or multi-wire conductor 124 may connect a bus-bar link 141 to an AC output of an inverter 120.

Figures 4, 5:
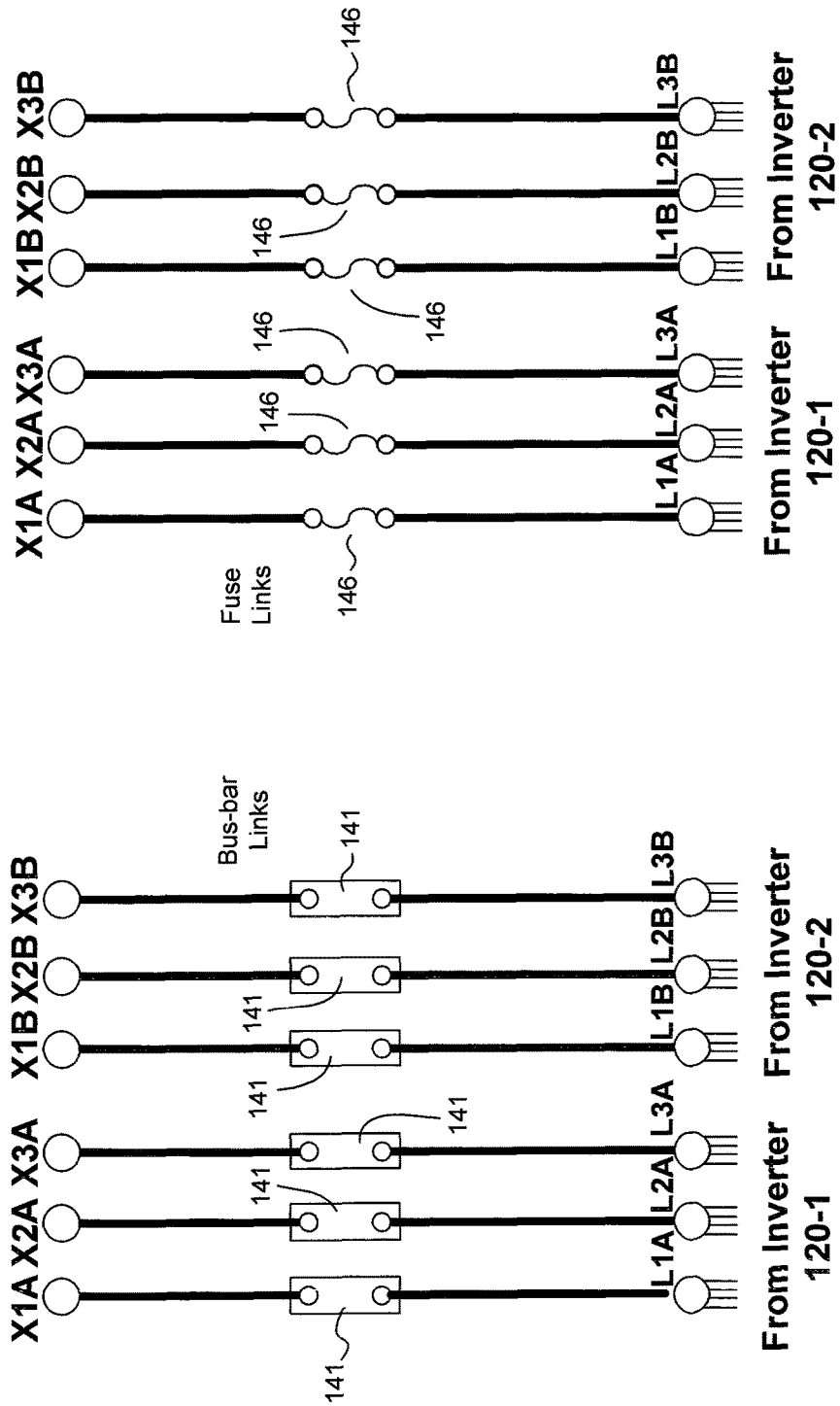
FIG. 4 shows a schematic diagram illustrating bus-bar links of the system of FIG. 2 in accordance with an embodiment of the present invention.
FIG. 5 shows a schematic diagram illustrating fuse links of the system of FIG. 3 in accordance with an embodiment of the present invention.

During normal operation, the bus-bar links 141 connect the AC outputs of the inverters 120 to corresponding low voltage terminals of the MV transformer 142. The bus-bar links 141 are designed such that they carry the full rated current of the inverters 120, and are arranged in a mechanical configuration such that they can be easily removed and replaced with a set of fuse-links 146 (see FIG. 3) for maintenance mode. FIG. 4 shows a schematic diagram illustrating bus-bar links 141 connecting the terminals L1A, L2A, and L3A from the inverter 120-1 to corresponding low voltage winding terminals X1A, X2A, and X3A of the MV transformer 142, and connecting the terminals L1B, L2B, and L3B from the inverter 120-2 to corresponding low voltage winding terminals X1B, X2B, and X3B of the MV transformer 142. The example shown is for a three-phase wiring, one wiring for each phase, for illustration purposes only.

FIG. 3 shows the connection configuration of the inverters 120 to the MV transformer 142 in maintenance mode. In maintenance mode, fuse links 146 (instead of the bus-bar links 141) serve as the inverter-transformer links. Prior to performing a maintenance task on the inverters 120, each bus-bar link 141 is replaced with a fuse link 146. Unlike the bus-bar links 141, which are rated to carry the full rated current of the inverters 120, the fuse-links 146 are rated to carry a fraction of the rated current of the inverters 120 such that fault-clearance time of the fuse-links 146 is sufficiently short to reduce arc flash energy well below the levels corresponding to PPE class 2 for the full range of available fault currents. A fuse-link 146 may comprise a fast acting fuse. With the fuse links 146, maintenance tasks that require the inverters 120 to remain powered ON may thus be employed in relative safety. Examples of maintenance tasks that require the inverters 120 to be powered ON include inverter output current and voltage measurements, leakage current measurements, harmonics measurements, thermal measurements, control, communication and monitoring circuits and functionalities diagnostics, or any other multimeter or oscilloscope measurements that may arise during maintenance and commissioning activities that require close access to live components inside the inverters. Should an arc fault situation were to arise during maintenance, the fast acting fuse links 146 are able to clear the arc within a few milliseconds to a few hundred milliseconds, thereby limiting the incident energy significantly well below 8 cal/cm$^2$. This allows maintenance personnel to safely perform maintenance tasks on the inverter station 190 using only PPE 2 level protection. On completion of the maintenance task, the fuse links 146 are removed and replaced with the bus-bar links 141 so that normal operation can be resumed. FIG. 5 shows a schematic diagram illustrating fuse links 146 connecting the terminals L1A, L2A, and L3A from the inverter 120-1 to corresponding low voltage winding terminals X1A, X2A, and X3A of the MV transformer 142, and connecting the terminals L1B, L2B, and L3B from the inverter 120-2 to corresponding low voltage winding terminals X1B, X2B, and X3B of the MV transformer 142.

Figures 6, 7:
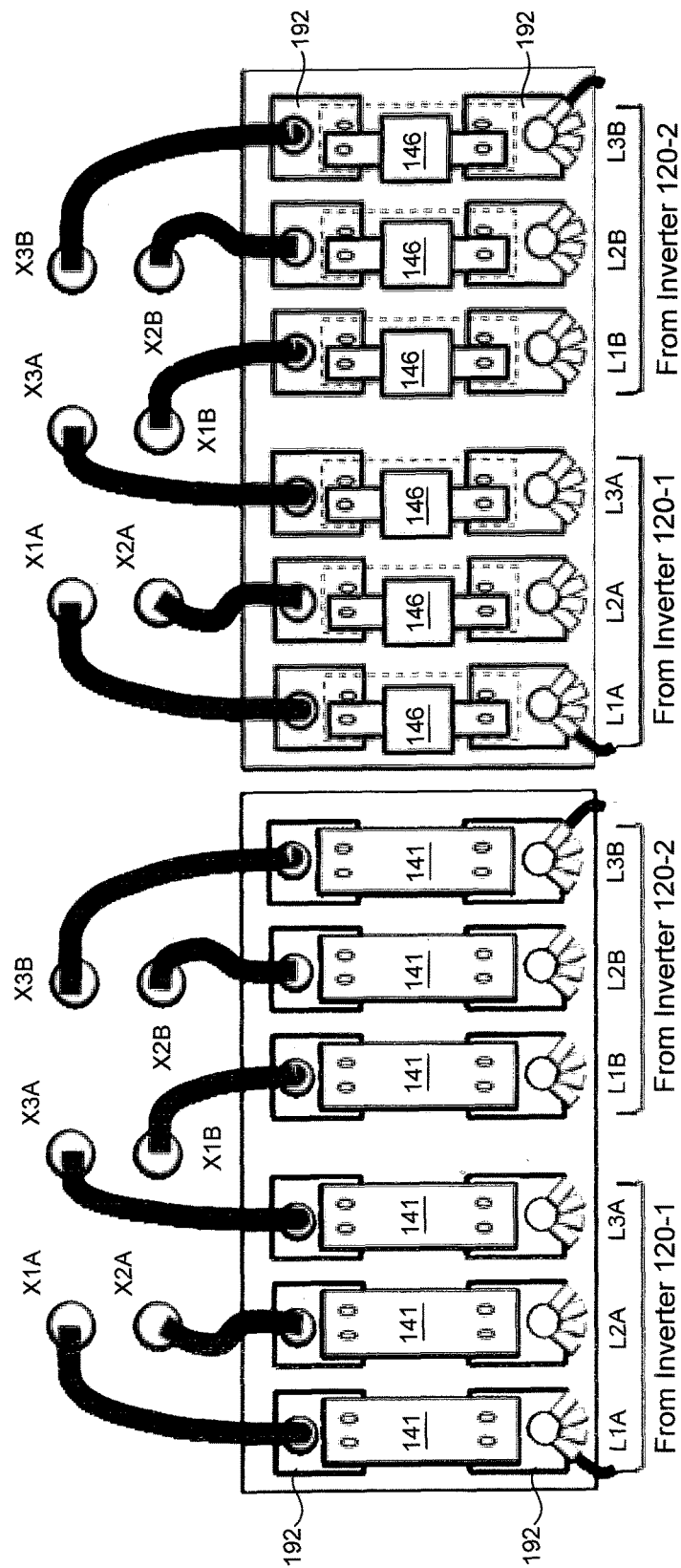
FIG. 6 show a schematic diagram of bus-bar links on interconnect holders in accordance with an embodiment of the present invention.
FIG. 7 show a schematic diagram of fuse links on interconnect holders in accordance with an embodiment of the present invention.

In one embodiment, the bus-bar links and the fuse links share a common physical spacing layout, termination footprint, and termination devices, such that procedures for replacing bus-bar links 141 with fuse links 146, and vice versa, can be performed reliably with ease and with minimal number of steps. This feature is schematically illustrated in FIGS. 6 and 7 where an interconnect holder 192 physically accommodates either a bus-bar link 141 or a fuse link 146. Each holder 192 allows for connecting a low voltage winding terminal of the MV transformer 142 (i.e., X1A, X2A, X3A, X1B, X2B, or X3B) to a corresponding terminal from an inverter 120 (i.e., L1A, L2A, L3A, L1B, L2B, or L3B). To change from normal mode to maintenance mode, the maintenance person simply has to remove the bus-bar links 141 from the interconnect holders 192 and install the fuse links 141 onto the holders 192. Similarly, to change from maintenance mode to normal operation mode, the maintenance person simply has to remove the fuse links 146 from the interconnect holders 192 and install the bus-bar links 141 onto the holders 192. During the swapping of the bus-bar links 141 with the fuse links 146 and vice versa, the entire inverter station 190A needs to be powered OFF and disconnected from the utility grid, which may be achieved by opening the MV disconnect switch 145 (shown in FIGS. 2 and 3), which is typically present at the high voltage side of the MV transformer 142.

With reference to FIGS. 2 and 3, a method of performing maintenance on an inverter 120 of a PV power plant 100 in one embodiment of the invention may involve putting the inverter station 190A in maintenance mode by powering OFF the inverters 120, disconnecting the inverter station 190A from the utility grid by opening the MV disconnect switch 145, replacing the bus-bar links 141 with the fuse-links 146, closing the MV disconnect switch 145, powering ON the inverters 120, and performing maintenance on one or more inverters 120 (while powered ON) with the fuse-links 146 in-place instead of the bus-bar links 141. The method further involves putting the inverter station 190A in normal operation mode by powering OFF the inverters 120, disconnecting the inverter station 190A from the utility grid by opening the MV disconnect switch 145, replacing the fuse links 146 with the bus-bar links 141, closing the MV disconnect switch 145, and powering ON the inverters 120 with the bus-bar links 141 in place instead of the fuse links 146.

Figure 8:
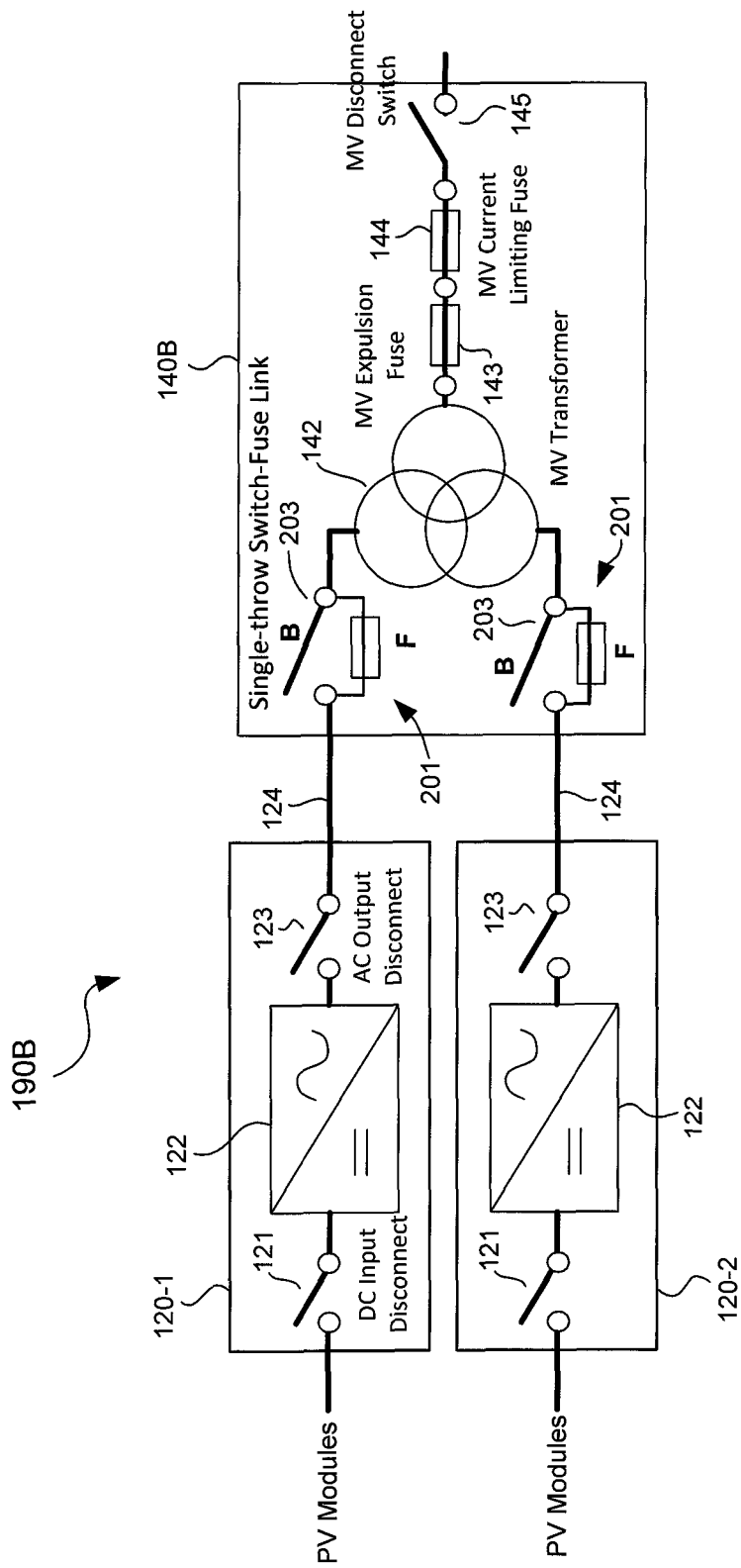
FIG. 8 shows a schematic diagram of another system in the form of an inverter station in accordance with an embodiment of the present invention.

Referring now to FIG. 8, there is shown a schematic diagram of a system in the form of an inverter station 190B in accordance with an embodiment of the present invention. The inverter station 190B is a particular embodiment of the inverter station 190A where the inverter-transformer links comprise switch-fuse links 201. The switch-fuse links 201 may be incorporated within the protective enclosure of the transformer housing, which is relabeled as "140B." Other components of the inverter 190B are otherwise as described with reference to FIGS. 2 and 3.

In one embodiment, as shown in FIG. 8, a switch-fuse link 201 comprises a fast acting fuse F and a single-throw switch 203. Like a fuse-link 146, the fuse F is rated for a fraction of the rated current of the inverters 120 such that fault-clearance time of the fuse F is sufficiently short to reduce the arc flash energy well below the levels corresponding to PPE2. The single-throw switch 203 may comprise a two-terminal single-throw disconnect switch.

During normal operation, the switch 203 is closed and in parallel with the fuse 201. The contacts B of switch 203 thus connect the inverter 120 to the MV transformer 142 during normal operation, just like the previously described bus-bar link 141 (see FIG. 2). Because of the parallel connection of the contact B of the switch 203 and the fuse F, the fuse F carries only a small fraction of the rated current of the inverter 120 during normal operation. During maintenance mode, the switch 203 is opened from being in parallel with the fuse F, allowing the fuse F to connect the inverter 120 to the MV transformer 142 just like the previously described fuse-links 146 (see FIG. 3).

Figure 9:
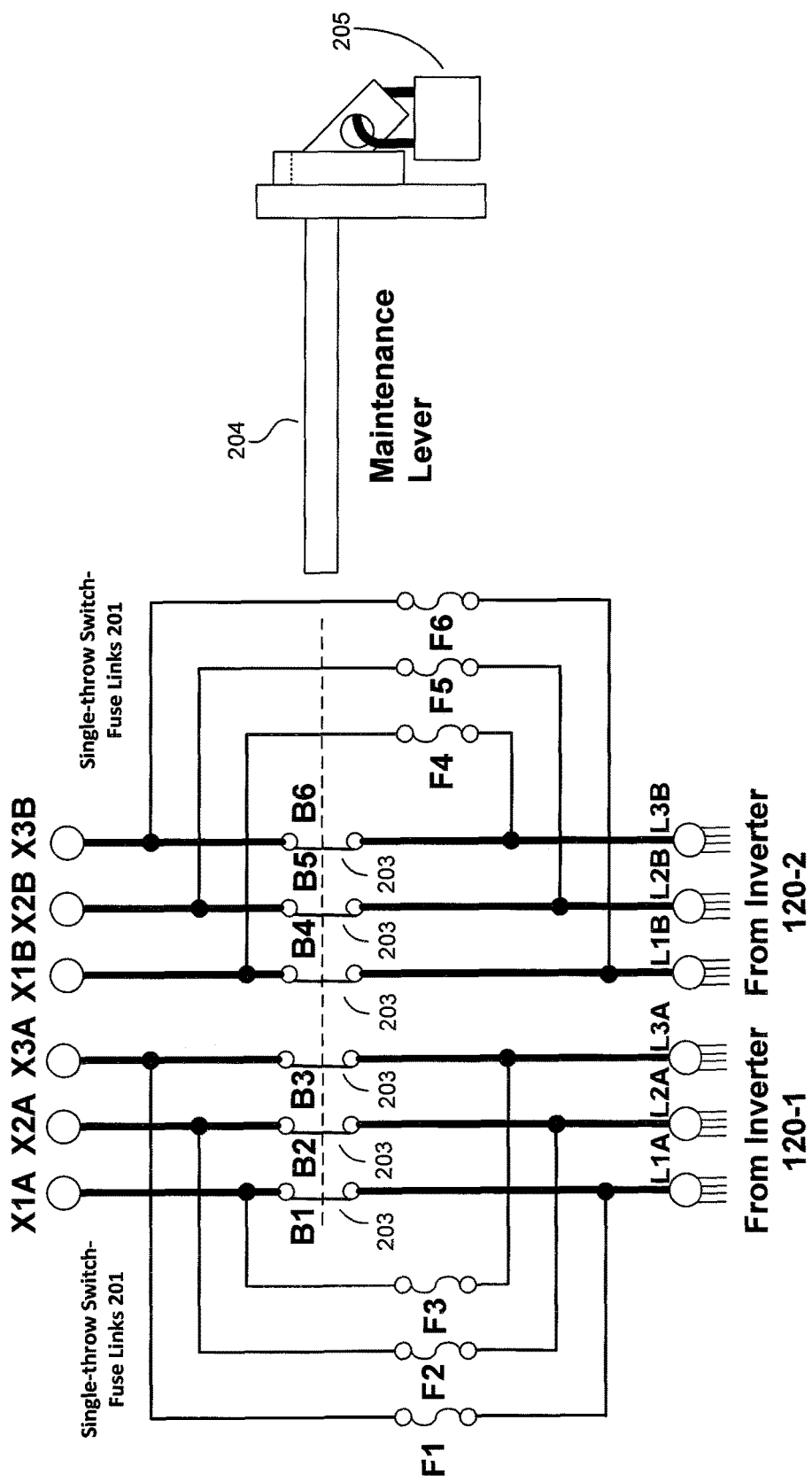
FIG. 9 schematically shows switch-fuse links of the system of FIG. 8 in accordance with an embodiment of the present invention.

FIG. 9 schematically shows the switch-fuse links 201 in accordance with an embodiment of the present invention. As explained, a switch-fuse link 201 may comprise a fuse F (i.e., F1, F2, F3, F4, F5, or F6) and a corresponding switch contacts B (i.e., B1, B2, B3, B4, B5, or B6) of switch 203. In the example of FIG. 9, the single-throw switches 203 are ganged together to be operable by a single maintenance lever 204, which may be accessible on the outside of the transformer housing. The MV transformer 142 winding terminals X1A, X2A, X3A, and X1B, X2B, X3B and the terminals L1A, L2A, L3A, L1B, L2B, and L3B from the inverters 120 are as previously described with reference to FIGS. 4 and 5.

In the example of FIG. 9, throwing the maintenance lever 204 into a first position (normal operation position) closes all the contacts B of the switches 203 to place the contacts B in parallel with corresponding permanently installed fuses F to place the inverter station 190B in normal operation mode. To place the inverter station 190B in maintenance mode, the maintenance lever 204 is thrown into a second position (maintenance position) to open the contacts B of the switches 203 such that the inverters and the MV transformer low voltage windings are connected through the fuses F. The maintenance lever 204 may be locked in place in a particular position with a padlock 205 for safety reasons. The switch-fuse links 201 advantageously eliminate the need to manually remove and install bus-bars and fuses to change mode of operations.

In the switch-fuse links 201, because the fuses F are always installed, the fuses F are still present and connected in parallel with the contacts B during normal operation. Consequently, each fuse F will carry a small fraction of the normal operating current. The amount of fuse current flowing during the normal operating condition may be reduced to a very small level by a circuit layout design of a switch-fuse link 201 with appropriate impedance matching between the contact B of a switch 203 and the fuse F. This is illustrated in FIG. 10, which schematically shows a switch-fuse link 201 in accordance with an embodiment of the present invention.

Figure 10:
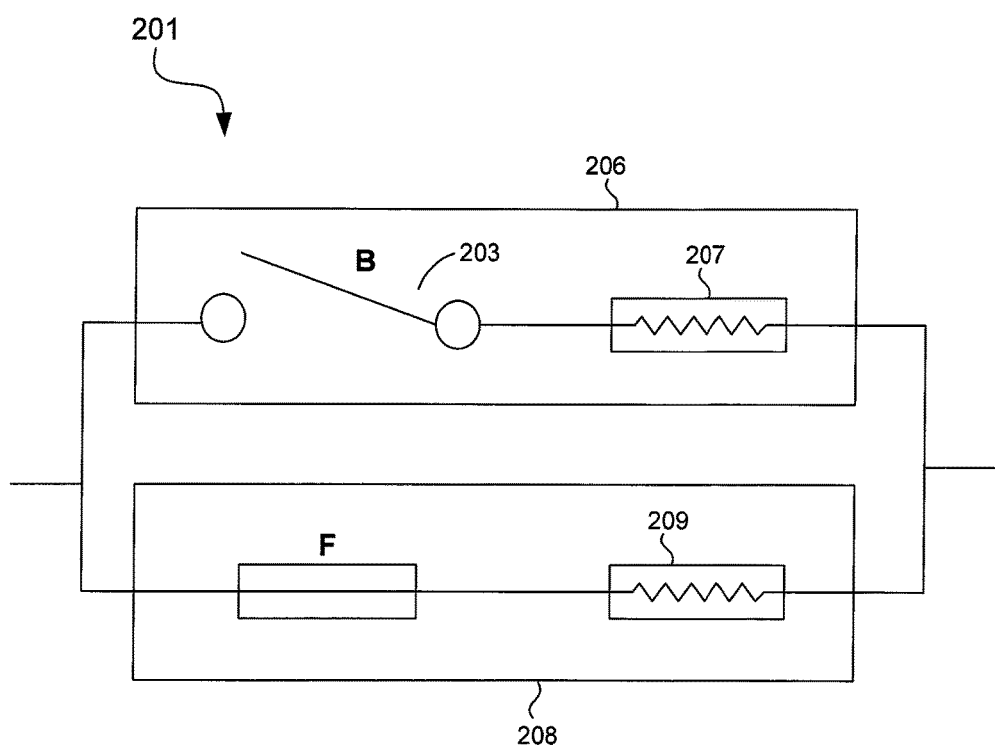
FIG. 10 schematically shows further details of the switch-fuse links of the system of FIG. 8 in accordance with an embodiment of the present invention.

In the example of FIG. 10, a circuit 206 that comprises the contact B of switch 203 has an equivalent series resistance 207. A circuit 208 that comprises the fuse F has an equivalent series resistance 209. If, for example, the equivalent series resistance 207 of the circuit 206 associated with the switch 203 is $R_{swi}$, then the circuit 208 of the corresponding fuse F is intentionally designed such that the equivalent series resistance 209 is equal to $k_i R_{swi}$, where $k_i \gg 1$. The equivalent impedances should be designed to meet environmental requirements for both normal operating and maintenance conditions.

Figure 11:
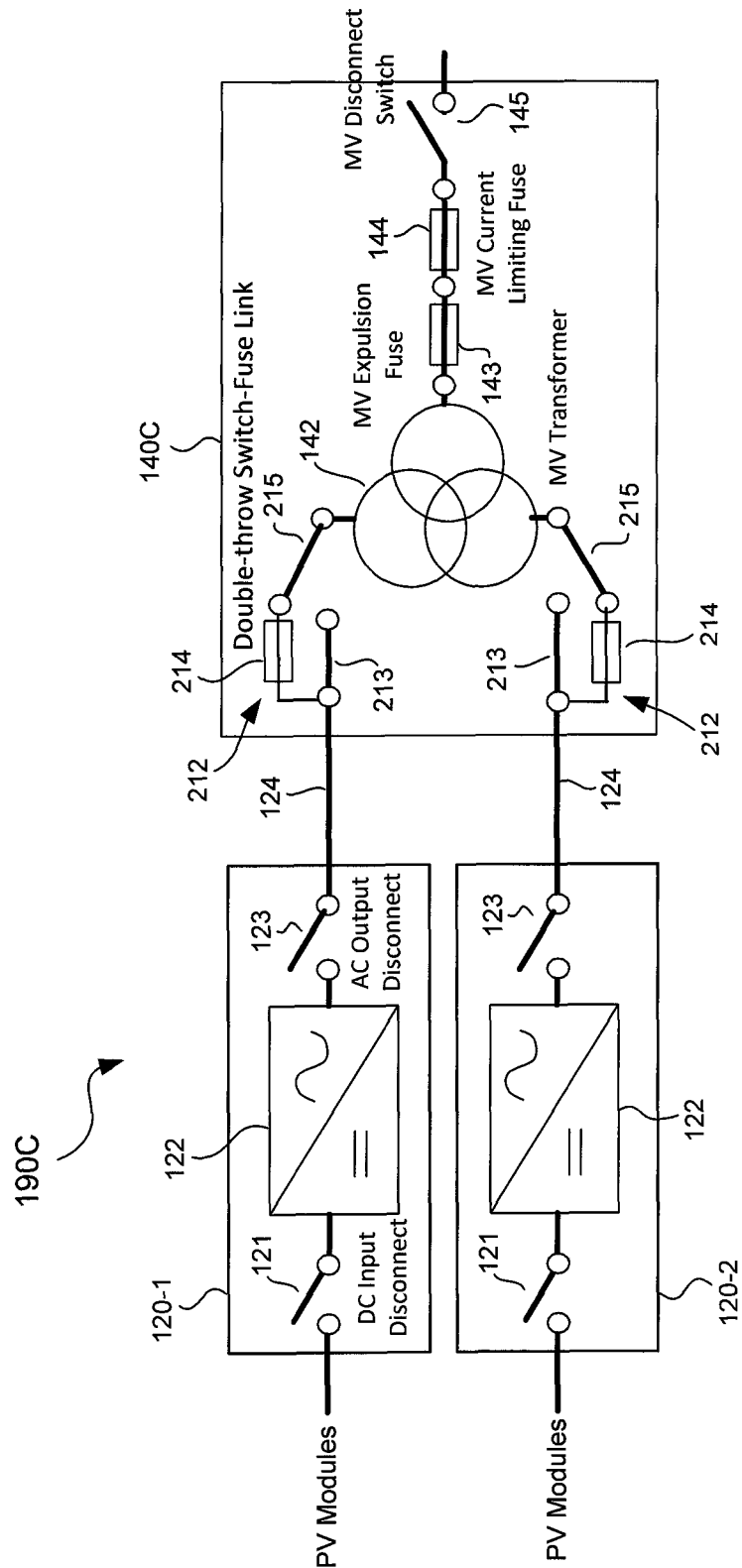
FIG. 11 shows a schematic diagram of yet another system in the form of an inverter station in accordance with an embodiment of the present invention.

Turning now to FIG. 11, there is shown a schematic diagram of a system in the form of an inverter station 190C in accordance with an embodiment of the present invention. The inverter station 190C is a particular embodiment of the inverter station 190A where the inverter-transformer links comprise switch-fuse links 212. The switch-fuse links 212 may be incorporated within the protective enclosure of the transformer housing, which is relabeled as "140C." Other components of the inverter 190C are otherwise as described with reference to FIGS. 2 and 3.

In one embodiment depicted in FIG. 11, a switch-fuse link 212 comprises a fast acting fuse 214, a bus-bar 213, and a double-throw switch 215. Like a fuse-link 146, the fuse 214 is rated for a fraction of the rated current of the inverters 120 such that fault-clearance time of the fuse 214 is sufficiently short to reduce the arc flash energy well below PPE 2. The double-throw switch 215 may comprise a transfer switch with two positions to connect the inverter 120 to the MV transformer 142 either through the fuse 214 or the bus-bar 213. That is, only one of the fuse 214 or the bus-bar 213 is connecting the inverter 120 to the low-voltage side of the MV transformer 142 at any given time. The fuse 214 and the bus-bar 213 may be permanently installed.

An advantage of using switch-fuse links 212 instead of switch-fuse links 201 (see FIG. 8) is that the fuses 214 do not carry any load current during normal operation. Consequently, the fuse sizing and circuit layout design considerations do not need to take into account continuous duty requirements, resulting in simpler electrical design. A trade-off is that the switch-fuse links 212 are typically more expensive to implement and physically bigger than the switch-fuse links 201.

Figure 12:
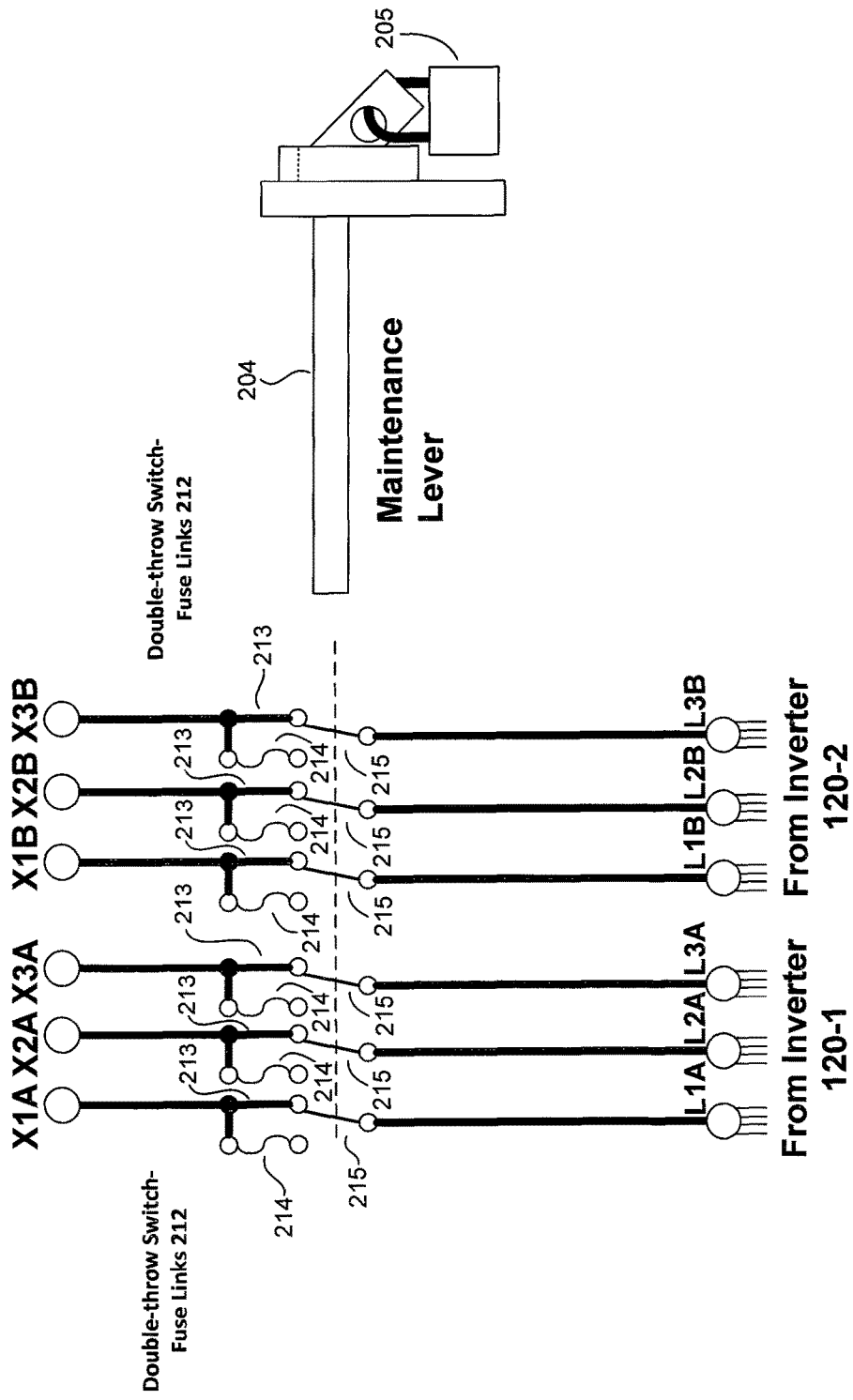
FIG. 12 schematically shows switch-fuse links of the system of FIG. 11 in accordance with an embodiment of the present invention.

FIG. 12 schematically shows the switch-fuse links 212 in accordance with an embodiment of the present invention. In the example of FIG. 12, the double-throw switches 215 are ganged together to be operable by the single maintenance lever 204, which may be accessible on the outside of the transformer housing. The MV transformer 142 winding terminals X1A, X2A, X3A, and X1B, X2B, X3B and the terminals L1A, L2A, L3A, L1B, L2B, and L3B from the inverters 120 are as previously described with reference to FIGS. 4 and 5.

In the example of FIG. 12, throwing the maintenance lever 204 into a first position connects the inverters 120 to the MV transformer 142 through series-connected bus-bar 213 to place the inverter station 190C in normal operation mode. To place the inverter station 190C in maintenance mode, the maintenance lever 204 is thrown into a second position to connect the inverters 120 to the MV transformer 142 through series-connected fuse 214. The maintenance lever 204 may be locked in place in a particular position with a padlock 205 for safety reasons.

In both the inverter stations 190B (see FIG. 8) and 190C (see FIG. 11), the procedure for switchover between normal operation and maintenance modes is performed with the inverter station completely powered OFF and disconnected from the utility grid to ensure that the switching procedure itself does not pose an arc flash hazard. This may be accomplished by opening the MV disconnect switch 145 (typically through a hot-stick) prior to operating the maintenance lever 204. An interlock mechanism may be employed to ensure the switchover between the two modes of operation is accomplished only with the MV disconnect switch 145 in the open (i.e., OFF) position.

Figure 14:
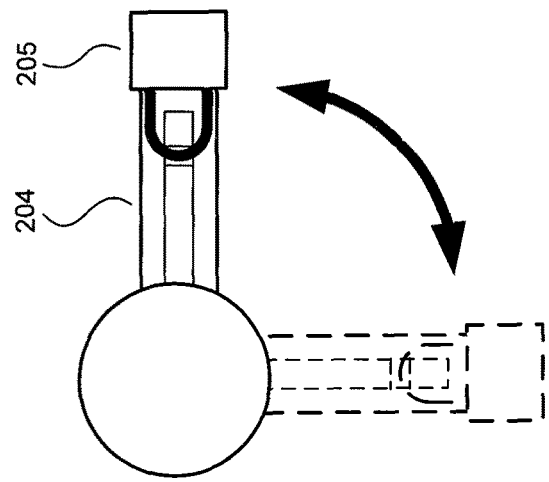
FIGS. 13 and 14 schematically illustrate operation of a maintenance lever in accordance with an embodiment of the present invention.
Figure 13:
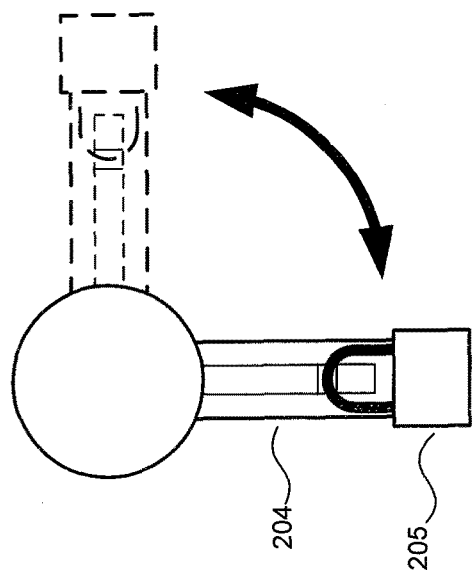

FIGS. 13 and 14 show the maintenance lever 204 in normal operation position (FIG. 13) and maintenance position (FIG. 14). The maintenance lever 204 may be locked in place using the padlock 205. When the maintenance lever 204 is placed in the normal operation position to place the inverter station in normal operation mode, the inverters 120 are connected to the low-voltage side of the MV transformer 142 through series connected switch contacts and/or bus-bars, e.g., contact B of switch 203 in the case of the switch-fuse links 201 and bus-bars 213 and the contact of switch 215 in the case of the switch-fuse links 212. When the maintenance lever 204 is placed in the maintenance position to place the inverter station in maintenance mode, the inverters 120 are connected to the low-voltage side of the MV transformer 142 through series connected switch contacts and/or fuses, e.g., fuses F in the case of the switch-fuse links 201 and fuses 214 and contact of switch 215 in the case of the switch-fuse links 212.

Figure 15:
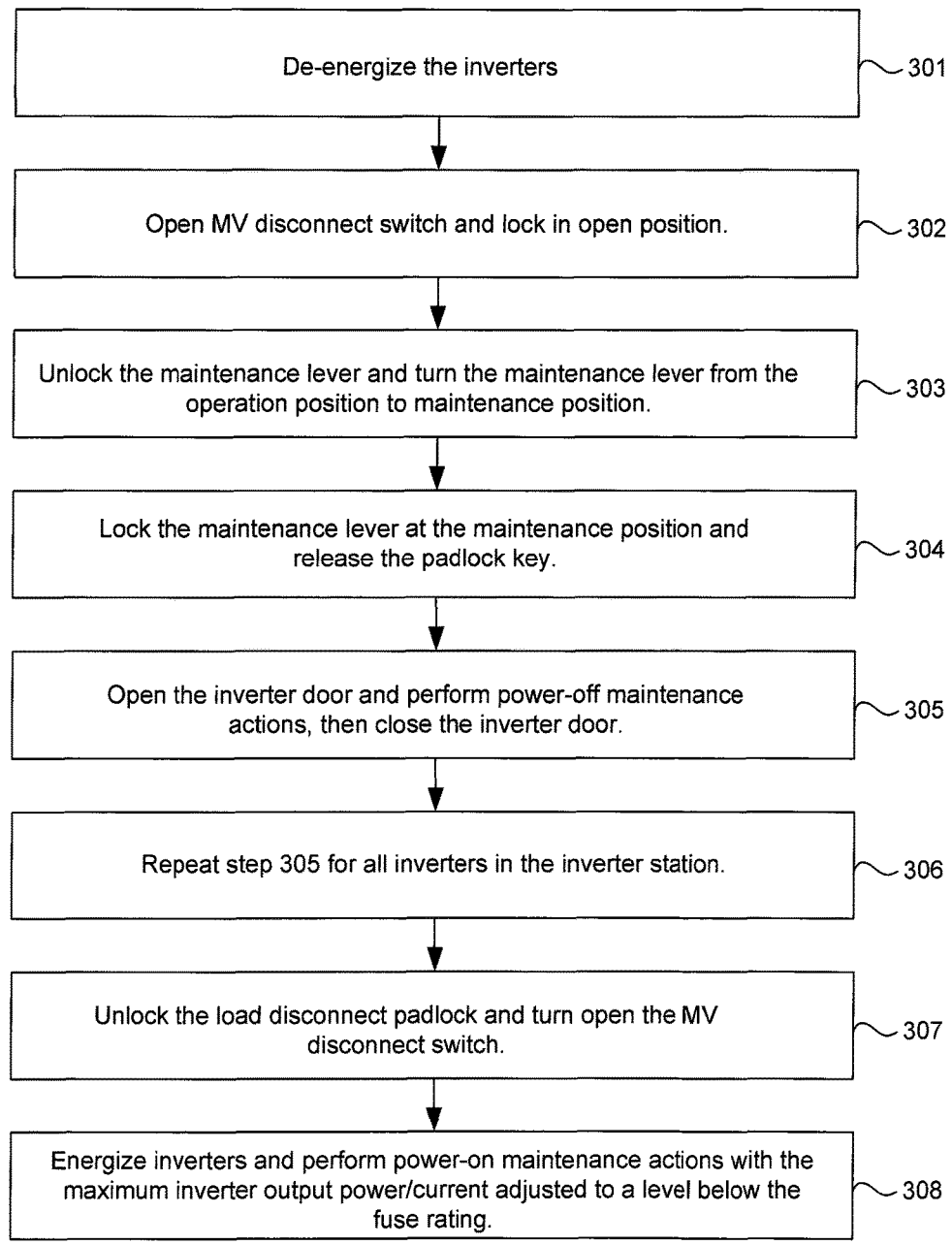
FIG. 15 shows a flow diagram of a method of switching an inverter station from normal operation mode to maintenance mode in accordance with an embodiment of the present invention.

FIG. 15 shows a flow diagram of a method of switching an inverter station 190 from normal operation mode to maintenance mode in accordance with an embodiment of the present invention. The method of FIG. 15 may be performed as a pre-maintenance procedure.

In the method of FIG. 15, the inverters 120 are powered OFF, and disconnected by opening their DC input disconnects 121 and AC output disconnects 123 (step 301). The MV disconnect switch 145 is opened (i.e., switched OFF) and locked in the open position with a load disconnect padlock having the same padlock key as the padlock 205 of the maintenance lever 204 (step 302); the padlock key is then released from the load disconnect padlock. The padlock key is used to unlock the maintenance lever 204, and the maintenance lever 204 is turned from the operation position to the maintenance position (step 303). The maintenance lever 204 is locked at the maintenance position and the padlock key is released (step 304). The doors of the inverter 120 are opened to perform any power-off maintenance actions, and then closed after the maintenance actions have been performed (step 305). Step 305 is repeated for all the inverters 120 in the inverter station (step 306). After performing the power-off maintenance actions, the load disconnect padlock is unlocked using the padlock key to allow the MV disconnect switch 145 to be closed, i.e., switched ON (step 307). The inverters 120 are powered ON, and reconnected by closing their DC input disconnects 121 and AC output disconnects 123 (step 308). Prior to powering on, the output power limit of the inverters 120 are set to a value smaller than the full rating that corresponds with, and is appropriate for, the rating of the fuses F of the switch-fuse link 201 or fuses 214 of the switch-fuse link 212. Power-on maintenance actions are then performed on the inverters 120. Note that during the power-on maintenance actions (i.e., maintenance actions performed while the inverters 120 are powered ON), the output power level of the inverters 120 are still limited as determined by the fuse ratings of the switch-fuse links 201 or 212, whichever is implemented, because the maintenance lever 204 is still locked in the maintenance position.

Figure 16:
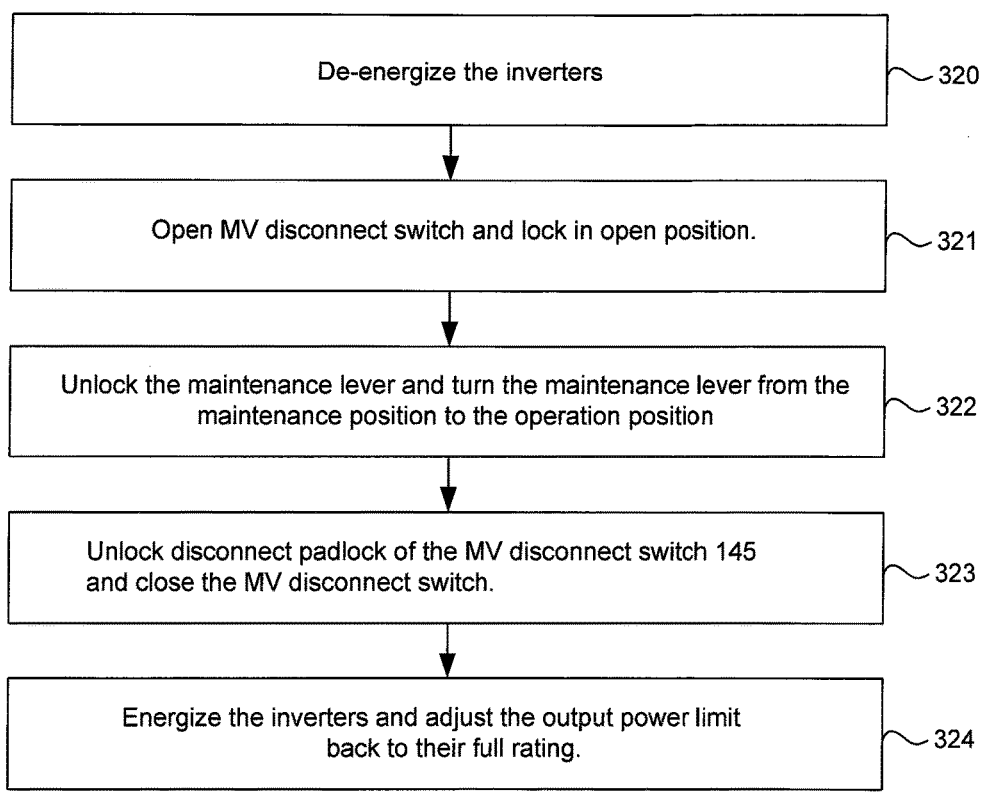
FIG. 16 shows a flow diagram of a method of switching an inverter station from maintenance mode to normal operation mode in accordance with an embodiment of the present invention.

FIG. 16 shows a flow diagram of a method of switching an inverter station 190 from maintenance mode to normal operation mode in accordance with an embodiment of the present invention. The method of FIG. 16 may be performed as a post-maintenance procedure following the method of FIG. 15.

In the method of FIG. 16, the inverters 120 are powered OFF, and disconnected by opening their DC input disconnects 121 and AC output disconnects 123 (step 320). The MV disconnect switch 145 is opened (i.e., switched OFF) and locked in the open position with the load disconnect padlock (step 321); the padlock key is then released from the load disconnect padlock. The padlock key is used to unlock the maintenance lever 204, and the maintenance lever 204 is turned from the maintenance position to the operation position (step 322). The maintenance lever 204 is locked in the operation position and the padlock key is released. The disconnect padlock of the MV disconnect switch 145 is unlocked, allowing the MV disconnect switch 145 to be closed (step 323). The MV disconnect switch 145 is locked in the closed position and the padlock key 205 is left captive in the disconnect padlock. The inverters 120 are powered ON, and reconnected by closing their DC input disconnects 121 and AC output disconnects 123 (step 324). The output power limit of the inverters 120 are then adjusted back to their full rating Note that in embodiments of the invention, the fuses limit the amount of power that can be transferred from the inverters to the utility grid due to their lower current rating in relation to the full rating of the inverters. This limitation does not impact typical maintenance activities and associated tests on the inverters as they do not require the need for full power operation during maintenance. Due to this limitation, during maintenance, as described in step 308 of FIG. 15, the power production from the inverters needs to be curtailed to within the limits allowed by the fuse rating, and this typically can be accomplished by software control of the inverters or by disconnection of several DC input circuits feeding into the inverters.

Table 1 shows a qualitative comparison of embodiments of the invention that employ switch-fuse links against a conventional solution that is based on circuit breakers. Although the material costs associated with the switch-fuse based solutions of FIGS. 8 and 11 are higher than that of the bus-bar and fuse link based solution of FIGS. 2 and 3, due to the voltage and high current rating of the switches and use of permanently installed fuses, the switch-fuse based solutions are still cost effective when compared to circuit breaker-based solutions. More importantly, both switch-fuse based solutions provide assured safety against potential arc-flash hazards in inverter stations, while the circuit breaker-based solution does not guarantee such assurance in particular when the available fault current and the resulting arc-flash current vary and can reach to a level that is lower than the fixed fast tripping current level of the circuit breaker. Also, depending on the size and the specific maintenance needs of the PV power plant, the bus-bar and fuse link based solution of FIGS. 2 and 3 may be the most cost effective solution.

TABLE 1

| | Circuit Breaker Solution | Fuse + Double-throw Switch Solution (FIG. 11) | Fuse + Single-throw Switch Solution (FIG. 8) | Bus-bar + Fuse Link Solution (FIGS. 2 and 3) |
|---|---|---|---|---|
| Estimated relative cost of the solution (per unit) | 1 | 0.6 | 0.5 | 0.3 |
| Power available during maintenance/commissioning | Full | Limited by the fuse sizing. Will require power curtailment of the inverters | | |
| Electrical design complexity | Medium | Medium | High | Low |
| Physical design complexity | Medium | High | High | Medium |
| Environmental design complexity | High | Medium-High | Medium-High | Low |
| Impact on normal operation | Potential for nuisance tripping | | None | |
| Arc-flash mitigation during maintenance | May not be assured for situations with varied and low available fault currents | | Assured | |
| Impact on maintenance operational steps | None | Medium | Medium | High |
| PPE level during maintenance | Dependent on the variation of the fault current availability | Solution can be tailored to meet PPE 2 or less | | |

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A system comprising:
a photovoltaic inverter that converts direct current (DC) generated by solar cells to alternating current (AC) that is provided at an AC output of the photovoltaic inverter;
a step up transformer having a low voltage winding on a low voltage side and a high voltage winding on a high voltage side, the high voltage winding being coupled to a utility grid; and
a switch-fuse link comprising a fuse and a switch, the switch comprising a first terminal and a second terminal, the second terminal being coupled to the low voltage winding, the switch further comprising a contact that connects the first terminal to the second terminal in a normal operation mode such that the AC generated by the photovoltaic inverter flows to the low voltage winding through the contact in the normal operation mode, the contact disconnects the first terminal from the second terminal in a maintenance mode such that the AC generated by the photovoltaic inverter flows to the low voltage winding through the fuse in the maintenance mode.

2. The system of claim 1, wherein the switch comprises a single-throw disconnect switch.

3. The system of claim 2, wherein the first terminal is coupled to the AC output of the photovoltaic inverter and the fuse is connected across the first terminal and the second terminal in both the normal operation and maintenance modes.

4. The system of claim 3, wherein the contact forms an electrical short across the fuse in the normal operation mode.

5. The system of claim 1, wherein the switch comprises a double-throw transfer switch.

6. The system of claim 5, wherein the fuse is connected to a third terminal of the switch.

7. The system of claim 6, wherein the fuse couples the AC output of the photovoltaic inverter to the third terminal in both the normal operation and maintenance modes.

8. The system of claim 7, wherein the AC output of the photovoltaic inverter is coupled to the first terminal in both the normal operation and maintenance modes.

9. The system of claim 1, wherein the switch-fuse link is installed within a protective enclosure that houses the step up transformer.

10. The system of claim 1, wherein the fuse is rated to carry less than a full rated current of the photovoltaic inverter.

11. A system comprising:
a photovoltaic inverter that converts direct current (DC) generated by solar cells to alternating current (AC) that is provided at an AC output of the photovoltaic inverter;
a step up transformer having a low voltage winding on a low voltage side and a high voltage winding on a high voltage side, the high voltage winding being coupled to a utility grid; and
a fuse that couples the AC output of the photovoltaic inverter to the low voltage winding of the step up transformer in a maintenance mode of the system, the fuse being rated to carry less than a full rated current of the photovoltaic inverter.

12. The system of claim 11, wherein the fuse is a fast acting fuse.

13. The system of claim 11, wherein a bus-bar, instead of the fuse, couples the AC output of the photovoltaic inverter to the low voltage winding of the step up transformer in a normal operation mode of the system.

14. The system of claim 13, further comprising an interconnect holder comprising a first contact and a second contact, wherein the fuse is across the first and second contacts in the maintenance mode and the bus-bar instead of the fuse is across the first and second contacts in the normal operation mode.

15. The system of claim 14, wherein the fuse and the bus-bar have a common physical spacing layout and termination footprint.

16. A method of performing maintenance on a photovoltaic system comprising:
powering OFF a photovoltaic inverter;
replacing a bus-bar that couples an alternating current (AC) output of the photovoltaic inverter to a low voltage winding of a step up transformer with a fuse that is rated to carry less than a full rated current of the photovoltaic inverter;
powering ON the photovoltaic inverter; and
performing maintenance on the photovoltaic inverter while the photovoltaic inverter is powered ON and the fuse is in place instead of the bus-bar.

17. The method of claim 16, further comprising:
powering OFF the photovoltaic inverter after performing maintenance on the photovoltaic inverter;
replacing the fuse with the bus-bar; and
powering ON the photovoltaic inverter for normal operation with the bus-bar in place instead of the fuse.

18. The method of claim 16, further comprising:
disconnecting a high voltage side of the step up transformer prior to replacing the bus-bar with the fuse.

19. The method of claim 16, wherein the fuse comprises a fast acting fuse.

20. The method of claim 16, wherein the method of claim 16 is performed on another photovoltaic inverter in a same inverter station as the photovoltaic inverter.

* * * * *